United States Patent [19]

Chiong et al.

[11] Patent Number: 4,613,398
[45] Date of Patent: Sep. 23, 1986

[54] FORMATION OF ETCH-RESISTANT RESISTS THROUGH PREFERENTIAL PERMEATION

[75] Inventors: Kaolin N. Chiong, Pleasantville; Bea-Jane L. Yang; Jer-Ming Yang, both of Yorktown Heights, all of N.Y.

[73] Assignee: International Business Machines Corporation, Armonk, N.Y.

[21] Appl. No.: 741,779

[22] Filed: Jun. 6, 1985

[51] Int. Cl.[4] .................. B44C 1/22; C03C 15/00; C03C 25/06; B29C 17/08
[52] U.S. Cl. .................. 156/628; 156/643; 156/646; 156/659.1; 156/668; 156/904; 427/41; 427/43.1; 430/313
[58] Field of Search .......... 156/628, 643, 646, 659.1, 156/668, 904; 427/43.1, 40, 41; 430/296, 313

[56] References Cited

U.S. PATENT DOCUMENTS

| | | | |
|---|---|---|---|
| 4,357,369 | 11/1982 | Kilichowski et al. | 427/90 |
| 4,396,704 | 8/1983 | Taylor | 430/311 |
| 4,426,247 | 1/1984 | Tamamura et al. | 156/643 |
| 4,430,153 | 2/1984 | Gleason et al. | 156/643 |
| 4,433,044 | 2/1984 | Meyer et al. | 430/271 |
| 4,552,833 | 11/1985 | Ito et al. | 430/325 |

FOREIGN PATENT DOCUMENTS 2154330A  9/1985  United Kingdom .

Primary Examiner—William A. Powell
Attorney, Agent, or Firm—Shirley Church Moore

[57] ABSTRACT

A method is provided for creation of oxygen etch-resistant polymeric films for use in the production of micron and submicron dimension patterns and fine lines. These etch-resistant polymeric films find use in fabrication of complex structures such as those in electronic devices and magnetic thin film heads. The etch resistance is achieved by incorporation of a protective-oxide-forming metal into a polymeric material using preferential permeation of organometallic materials into the polymeric material.

30 Claims, 23 Drawing Figures

FORMATION OF ETCH-RESISTANT RESISTS THROUGH PREFERENTIAL PERMEATION

BACKGROUND OF THE INVENTION

1. Field of the Invention

The present invention is concerned with a method of forming etch-resistant polymeric resists for use in the creation of micron and submicron dimension patterns and fine lines. These etch-resistant polymeric resists find use in fabrication of complex structures such as those in electronic devices and magnetic thin film heads.

2. Background Art

Many of the recent advancements in electronic devices and components have resulted from improvements in manufacturing techniques. Some of the most important improvements have occurred in microlithography and in methods of transferring the patterns used to create the complex structures within the electronic devices.

One of the preferred methods of transferring patterns of micron and submicron dimensions is dry etching. This method utilizes plasma or reactive ion etching to remove specific areas of material on a surface so that a pattern remains. In many instances, this method of pattern creation has replaced conventional processes which use solvent development of a material to create a pattern. The solvent development or wet processing techniques frequently do not permit the dimensional control desired in the creation of micron and submicron dimensional patterns; the dry etching techniques do permit such dimensional control.

The material to be dry etched to create the pattern is often a polymeric material due to ease of use, material properties, and cost considerations. When an organic polymeric material is used, dry etching can be done using an oxygen plasma or oxygen reactive ion etching. Upon exposure to an oxygen plasma or to oxygen reactive ion etching, the organic content of the polymer is converted to gaseous forms which are easily removed. In order to create the pattern, there must be some areas of the polymeric material which are resistant to oxygen plasma or oxygen reactive ion etching and other areas of the polymeric material which are not. A preferred method of producing an etch-resistant polymeric material is to utilize a polymeric resist material containing silicon in a sufficiently large quantity so that exposure to oxygen plasma, for example, results in formation of silicon oxides (which form a protective layer to prevent the conversion to gaseous form of organic materials beneath). Metals other than silicon, which are capable of forming protective oxide layers, can be used as well.

Examples of silicon-containing copolymers, comprising a compound containing an acrylate moiety and a siliconcontaining oxime ester of methacrylic acid, which act as a positive resist and which can be dry developed are disclosed in U.S. Pat. No. 4,433,044 to Meyer et al. A method of selectively removing a portion of a layer of material on a substrate by oxygen plasma etching, utilizing a mask of resist material comprising a poly (silane sulfone) copolymer is disclosed in U.S. Pat. No. 4,357,369 to Kilichowski et al. A method of producing solid state devices by dry etching of a resist film comprising a silicon-containing or nonsilicon-containing but organometallic monomer-containing polymer is described in U.S. Pat. No. 4,396,704 to G. N. Taylor.

Another method for forming a micropattern using a technique similar to those above is disclosed in U.S. Pat. No. 4,430,153 to Gleason et al. The method involves forming an etch barrier in the reactive ion etching of an aromatic polyamic acid/imide polymer. The method comprises: coating a surface with a layer of an aromatic polyamic acid; at least partially curing the layer of aromatic polyamic acid to the corresponding aromatic poly-imide; in situ converting the surface layer of the aromatic polyimide to a silicon-containing alkyl polyamide/imide; applying, exposing, and developing a layer of photoresist over the silicon-containing alkyl polyamide/imide, to selectively expose a portion of the silicon-containing alkyl polyamide/imide surface layer; reactive ion etching the exposed portion of the surface layer of the silicon-containing alkyl polyamide/imide with carbon tetrafluoride to remove the exposed portion of the silicon-containing alkyl polyamide/imide surface layer; and subsequently using the oxygen-etch-resistant, silicon-containing polyamide/imide polymer as a mask in processing of underlying layers which can be oxygen reactive ion etched.

Another method for forming a micropattern using a technique similar to those above is disclosed in U.S. Pat. No. 4,426,247 to Tamamura et al.. This method comprises the steps of forming an organic polymeric material layer on a substrate, forming a silicone layer on the organic polymeric material layer, selectively irradiating a surface of the silicone layer with a high-energy beam, exposing the surface of the silicon layer to a radical addition polymerizable monomer gas so as to form a graft polymer film on an irradiated portion of the surface of the silicon layer, performing reactive ion etching using the graft polymer film as a mask so as to form a silicon pattern, and performing reactive ion etching using the silicone pattern as a mask to protect underlaying organic polymeric layers, so as to form an organic polymeric material pattern.

Recently, processes have been developed which permit selective conversion of portions of a non-silicon-containing resist to a silicon-containing etch-resistant resist. The non-silicon-containing resist is exposed to patterned radiation to create a latent image within the resist. The latent image within the resist is then reacted with an organometallic reagent to incorporate an oxide-forming metal such as silicon into the image. The "siliconized" latent image is then dry developable, and the etch-resistant images, as well as underlaying organic polymeric material, can then be dry etched using an oxygen plasma to simultaneously develop and transfer the pattern through to a non-organic substrate below. Examples of this latter method of obtaining dry-developable multilayer resists are described in U.S. patent applications Ser. Nos. 609,690 filed May 14, 1984, U.S. Pat. No. 4,552,833, 679,527, filed Dec. 7, 1984 and 720,781, filed Apr. 8, 1985 (assigned to the assignee of the present invention). The disclosures of these three U.S. patent applications are incorporated by reference herein. Note that the metallic portion of the organometallic material can be selected from Group III A metals, Group IV A metals, Group IV B metals, and Group VI B metals. Examples of Group IV A metals are tin, germanium, and silicon. Examples of Group IV B metals are titanium and zirconium. Examples of Group VI V metals are tungsten and molybdenum. An example of a Group III A metal is aluminum. The preferred metallic portions are titanium, silicon, and tin, with the most preferred being silicon.

However, the methods of creating dry-developable multilayer resists described in the three U.S. patent applications above provide a negative tone pattern, and many practitioners within the electronics industry prefer to use a positive tone pattern. (A negative tone pattern is obtained when the portion of the resist exposed to the patterned radiation remains after development of the pattern; a positive tone pattern is obtained when the portion of the resist exposed to the patterned radiation is removed during development of the pattern.)

In addition, the first two methods, described in applications Ser. Nos. 609,690 and 679,527 preferably utilize polymeric materials which initially do not contain any reactive functional groups such as hydroxyl, amine, carboxyl, phenol, or imide NH, which are capable of reacting with an organometallic reagent. The reactive functional groups are created within the polymeric material using irradiation, photoactive compounds which are added to the polymeric material which subsequently react with the polymeric material after exposure to radiation, and combinations thereof. These methods encounter difficulties on application to novolak resist materials of the type most commonly used in electronics industry lithography.

In order to alleviate the difficulties referred to above, and enable the creation of positive tone resist patterns as well as negative tone resist patterns, an additional method was developed. The additional method provided for wet development of the latent image created within the resist upon exposure to patterned radiation, with subsequent processing to render the resist material remaining after development etch resistant. The etch resistant resist material could then be used to transfer the pattern to underlaying polymeric layers. This method is disclosed in U.S. patent application Ser. No. 713,370, filed Mar. 19, 1985 assigned to the assignee of the present invention, and incorporated herein by reference.

In view of all of the above methods, there remains a need for a method of producing etch-resistant positive tone resist patterns using only dry development techniques. In addition, a simple method of achieving image reversal (the ability to alter the pattern created from positive to negative tone, or the reverse) would be highly desirable.

SUMMARY OF THE INVENTION

In accordance with the present invention, a method is provided for creating oxygen etch-resistant polymeric films for use in the production of electronic devices. The method provides for the generation of etch-resistant, positive tone resist patterns using only dry development techniques. In addition, the method provides for image reversal. Etch-resistance is provided by incorporation of a protective-oxide-forming metal of the type previously described into a polymeric material using preferential permeation of organometallic materials into the polymeric material. It is possible to merely permeate organometallic materials into the resist material for some applications, and preferable to have the organometallic material permeate and react with the resist material for other applications, depending on the propensity of the organometallic material to remain at the desired location during subsequent process steps.

Polymeric materials which can be used in the method of the present invention include both materials which have reactive functional groups (capable of reacting with an organometallic reagent) prior to irradiation or chemical modification, and materials which have reactive functional groups only after irradiation or chemical modification. For purposes of clarity, to distinguish the polymeric resist materials of the present invention from metal-containing polymers of the type described in the U.S. patents discussed in the background art, the polymeric resist materials of the present invention (prior to treatment with an organometallic material) are understood to contain insufficient metal atoms to form the protective metal oxide layer necessary to have an etch-resistant material on exposure to reactive oxygen-containing environments such as oxygen plasmas.

The present invention provides a method of creating etch-resistant polymeric films for use in the production of electronic devices, comprising:

(a) applying a layer of polymeric resist material to a substrate;

(b) exposing the layer of polymeric resist material to at least one kind of patterned radiation capable of altering the permeability of polymeric resist material; and (c) preferentially permeating/diffusing an organometallic material into the surface of polymeric resist material, to provide etch resistance within the portion of polymeric resist material within which significant permeation of organometallic material occurs.

A positive tone pattern is obtained when exposure of the polymeric resist material to the patterned radiation decreases the permeability of the resist material within the irradiated areas.

A negative tone pattern is obtained when exposure of the polymeric resist material to the patterned radiation increases the permeability of the resist material within the irradiated areas.

The polymeric resist material may be comprised of a sensitizer/photoactive compound and a polymeric material, or it may be comprised of a polymeric material which contains photoactive functional groups as part of its molecular structure, or any combinations thereof. The polymeric material used in combination with the photoactive compound may or may not contain functional groups which are reactive with organometallic reagents.

The organometallic material to be permeated into the polymeric resist material may be in the form of a gaseous or condensed phase.

For applications where the mere permeation of the organometallic material is sufficient, the method depends on whether a negative tone or a positive tone image is desired.

When a positive tone image is desired, the method comprises:

(a) applying a layer of polymeric resist material to a substrate;

(b) exposing the layer of polymeric resist material to radiation capable of decreasing the permeability of the polymeric resist material in the irradiated area; and (c) preferentially permeating/diffusing an organometallic material into the more permeable, nonirradiated areas of the polymeric resist material, to provide an etch-resistant positive tone latent image within the resist.

The positive tone image can then be dry developed using oxygen plasma or oxygen reactive ion etching. The dry-developed pattern can also be transferred to any underlaying organic polymeric materials using oxygen plasma or oxygen reactive ion etching.

When a negative tone image is desired, the method comprises:

(a) applying a layer of polymeric resist material to a substrate;

(b) exposing the layer of polymeric resist material to radiation capable of increasing the permeability of the polymeric resist material in the irradiated area; and (c) preferentially permeating an organometallic material into the more permeable, irradiated areas of the polymeric resist material, to provide an etch-resistant negative tone latent image within the resist.

The negative tone image can then be dry developed using oxygen plasma or oxygen reactive ion etching. The dry-developed pattern can also be transferred to any underlaying organic polymeric materials using oxygen plasma or oxygen reactive ion etching.

For applications where it is preferable to have the organometallic material react with the polymeric resist material, again, the method depends on whether a negative tone or positive tone image is desired; the method also depends on whether the polymeric resist material contains sites (functional groups such as, but not limited to, hydroxyl, amine, carboxyl, phenol, and imide NH) capable of reacting with the organometallic material or whether such sites must be generated within the polymeric resist material.

When the polymeric resist material contains sites capable of reacting with the organometallic material and a positive tone image is desired, the method comprises:

(a) applying a layer of polymeric resist material to a substrate;

(b) exposing the layer of polymeric resist material to radiation capable of decreasing the permeability of the polymeric resist material in the irradiated area; and (c) preferentially permeating and reacting an organometallic material within the more permeable, nonirradiated areas of the resist to provide an etch-resistant positive tone latent image within the resist.

When the polymeric resist material contains sites capable of reacting with the organometallic material and a negative tone image is desired, the method comprises:

(a) applying a layer of polymeric resist material to a substrate;

(b) exposing the layer of polymeric resist material to radiation capable of increasing permeability within the polymeric resist in the irradiated area; and (c) preferentially permeating and reacting an organometallic material into the permeable, irradiated areas of the resist to provide an etch-resistant negative tone latent image within the resist.

For particular polymeric resist systems which are affected differently by the intensity or type of radiation used to create the latent image within the resist, it is possible to use the same polymeric resist material and obtain a positive or negative tone image depending on whether the response of the polymeric resist material to radiation is to increase permeability or to decrease permeability. For example, when one intensity of radiation is used, the predominant reaction in the polymeric resist material may be fragmentation, which results in formation of smaller molecules or generation of gaseous compounds, so that permeability of the polymeric resist material is increased. However, when a different intensity of radiation is used, the predominant reaction within the polymeric resist material may be crosslinking of polymer molecules so that an increased molecular weight results and the permeability of the polymeric resist material is decreased. The same phenomena can occur when the type of radiation changes, so that the energy transmitted to the polymeric resist material affects it differently. Even a change in the wavelength of the radiation can produce a change from an increase in permeability to a decrease in permeability, as will be illustrated by examples within this specification.

When it is preferable to react the organometallic material with the polymeric resist material, and the polymeric resist material does not contain sites capable of reacting with the organometallic material, the method of obtaining a positive tone image comprises:

(a) applying a layer of polymeric resist material to a substrate;

(b) exposing the layer of polymeric resist material to radiation capable of decreasing the permeability within the polymeric resist in the irradiated area;

(c) exposing the layer of polymeric resist material to radiation capable of creating reactive sites at least in the more permeable areas of the polymeric resist; and (d) preferentially permeating and reacting an organometallic material into the more permeable areas of the resist, to provide an etch-resistant positive tone latent image within the resist.

For polymeric resist materials wherein reactive sites are created within the entire area of the resist irradiated in step (c) above, and blanket irradiation of the polymeric resist surface is used, it does not matter whether step (b) or step (c) above is performed first, since it is the difference in permeability of the imaged areas of the resist which results in preferential permeation of the organometallic material, thus controlling the extent of reaction of the organometallic material with the polymeric resist material.

In polymeric systems wherein a decrease in permeability is accompanied by a decrease in ability of the radiation to penetrate the polymeric resist material, and thus a decrease in the ability to create reactive sites, it is advantageous to perform step (b) prior to step (c).

In the event that reverse image masking is used to generate reduced permeability in one image pattern and to create reactive sites in the reverse pattern areas, it does not matter whether step (b) or step (c) is performed first.

When it is preferable to react the organometallic material with the polymeric resist material and the polymeric resist material does not contain sites capable of reacting with the organometallic material, the method of obtaining a negative tone image comprises:

(a) applying a layer of polymeric resist material to a substrate;

(b) exposing the layer of polymeric resist material to radiation capable of increasing permeability and creating reactive sites simultaneously within the irradiated areas of the resist, to provide an etch-resistant negative tone latent image within the resist.

For polymeric resist materials which require a different type of radiation or a different intensity of radiation to create permeability than that required to create reactive sites, it is necessary to use three steps in the method. Step (a) remains the same, step (b) provides for exposure of the polymeric resist material to one form of radiation to increase permeability and step (c) provides for exposure of the polymeric resist material to another form of radiation to create reactive sites. Steps (b) and (c) need not be performed in a specific order.

DESCRIPTION OF THE DRAWINGS

FIGS. 14A–17 show the embodiment of the present invention wherein the polymeric resist material is affected differently by intensity or kind of radiation, and this characteristic is used to obtain image and pattern reversal. FIGS. 16A–17 represent the method of obtaining a positive tone image, wherein patterned radiation is applied to the surface of the resist, the dominant reaction is crosslinking in the irradiated areas, and the etch-resistant latent image is created in the areas not exposed to the patterned radiation. FIGS. 14A–15 represent the method of obtaining a negative tone image, wherein the same pattern of radiation, but a different kind or intensity of radiation, is applied to the surface of the resist, but the dominant reaction is fragmentation in the irradiated areas, and the etch-resistant latent image is created in the areas exposed to the patterned radiation.

DESCRIPTION OF THE PREFERRED EMBODIMENTS

Figure 1:
FIGS. 1–3 illustrate a method wherein a positive tone etch-resistant latent image is created by: applying a layer of polymeric resist material to a substrate; exposing the layer of polymeric resist material to radiation capable of crosslinking the polymeric resist in the irradiated area; and preferentially permeating an organometallic material into the non-crosslinked, nonirradiated areas of the resist. The etch-resistant latent image created within the resist is dry developed to produce the patterned resist shown in FIG. 4. These figures represent two embodiments of the present invention; the embodiment wherein the organometallic material merely permeates and remains in place, and the embodiment wherein there are reactive sites throughout the non-metal-containing polymeric resist capable of reacting with the organometallic material, and reaction occurs within the areas where the organometallic material is able to preferentially permeate (the non-crosslinked areas).

The present invention discloses a method of creating an etch-resistant resist through preferential permeation of an organometallic material into patterned areas of different permeability within the resist material. The present invention discloses the permeation of the organometallic material either to a controlled depth within a resist layer thickness or permeation through the entire thickness of a layer of resist material. The depth of permeation/diffusion of the organometallic material into the thickness of the resist layer affects the obtainable profile of the wall structure through the thickness of the patterned resist. Penetration of the organometallic material all the way through the resist layer generates a resist wall profile defined mostly by the spatial distribution of radiation intensity through the resist thickness. Controlled depth of penetration of the organometallic material permits the generation of straight-walled resist structures or undercut wall structures upon dry development, depending on the etch process conditions. Note that in this latter case wherein only the top portion of the resist layer is etch-resistant, it is the process conditions during etching, rather than the radiation profile through the resist thickness, which controls the resist wall profile.

Selection of the polymer for use in the resist material is based on physical and chemical properties of the polymer such as absorptivity and sensitivity to molecular scission, crosslinking, or other reaction upon exposure to various radiation sources. Among the additional polymer properties of interest are thermal stability, ability to form coating solutions, and electrical properties (if the patterned resist is to become part of the electronic device).

The polymeric resist material must contain a photo active component (PAC) which is sensitive to the radiation source to be used to create the pattern within the resist material. Some polymers are sensitive to radiation in themselves and others require the addition of a photo active compound (which is sensitive to the radiation source) to the polymeric material. The photo active compound may react with (become covalently linked to) the polymer or may remain in the form of a mixture with the polymer. The polymer may or may not contain functional groups capable of reacting with the organometallic material (such as hydroxyl, amine, carboxyl, phenol or imide NH), but polymers containing such functional groups are preferred.

The polymeric resist material is exposed to a patterned radiation source which either causes increased permeability (via a form of fragmentation or gaseous product generation within the photoactive compound or the polymer itself) or decreased permeability (via crosslinking or other reaction which alters the molecular structure of the resist material, making penetration of the organometallic material more difficult). When the radiation penetrates uniformly throughout the entire resist thickness in the patterned area, permeability is altered uniformly. It is also possible to affect the uniformity of radiation intensity through the resist thickness by adjusting the concentration of absorptive components or by adding absorptive dyes to the polymeric resist material. Controlled variation of radiation intensity through the resist thickness can be used to control the resist wall structure profile by altering permeability through the resist thickness.

An organometallic material is then preferentially permeated into the polymeric resist material to create a patterned latent image which is etch-resistant, enabling subsequent dry development of the resist. The ability of the organometallic material to permeate into patterned areas of the polymeric resist material is the result of changes in porosity, polarity (for example, hydrophobicity/hydrophilicity), swelling characteristics of the polymeric resist material, or combinations thereof in the patterned, irradiated area. Whether the final etch-resistant patterned area within the polymeric resist material is a positive tone or negative tone latent image depends upon which factors are more dominant in affecting permeability. For instance, when both photofragmentation and crosslinking occur simultaneously upon irradiation, but crosslinking is the dominant factor, the result is a positive-tone image because the crosslinking effectively reduces permeation of the organometallic material in the irradiated areas. When photofragmentation is the dominant factor, the result is a negative-tone image because the fragmentation effectively increases permeability of the organometallic material in the irradiated areas. Examples of a method of controlling which factor is dominant will be presented later in Examples 1 and 2. In addition to control of permeability in patterned areas of the polymeric resist material itself, the degree of permeation/penetration within the more permeable areas of the polymeric resist can be further controlled by process parameters such as length of contact time between the resist material and the organometallic material, contact temperature, and form (gaseous or condensed phase) of the organometallic material.

Figure 2:
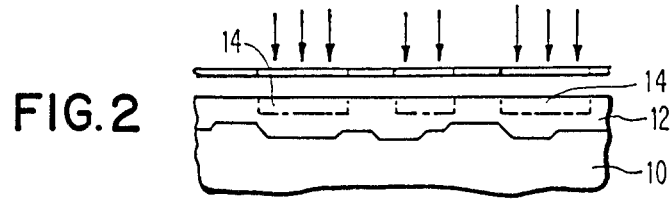
Figure 3:
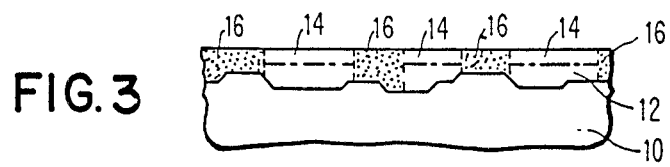
Figure 4:
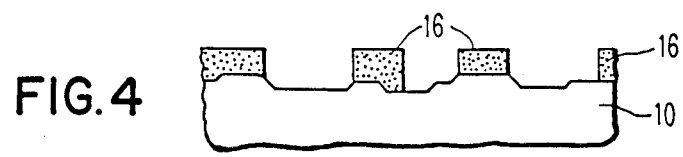

Referring now to FIGS. 1–4, which can be used to illustrate two embodiments of the method of the invention which create a positive tone pattern in the resist: A layer of polymeric resist material 12 is applied over the surface of a substrate 10, as shown in FIG. 1. The surface of the polymeric resist material 12 is then exposed to patterned radiation in order to reduce permeability in the exposed areas 14, as depicted in FIG. 2. The pattern may be created using a mask technique as shown in FIG. 2, or may be created by direct writing of the pattern upon the surface of the resist material. In addition, the depth of penetration of the radiation into the resist thickness may be partial as shown in FIG. 2, or may be through the entire thickness of the resist material. An organometallic material is now applied to the surface of the polymeric resist material 12,14 and allowed to preferentially permeate/diffuse within areas 16 of the resist which have not been reduced in permeability and which are not protected from permeation by areas of reduced permeability 14, as shown in FIG. 3. In one embodiment of the invention, the organometallic material merely diffuses and remains in place. In another embodiment, the organometallic material reacts with functional groups at sites within the polymeric resist material. The areas in which preferential diffusion of the organometallic material has occurred 16 are referred to as an etch-resistant latent image within the resist elsewhere within this disclosure. FIG. 4 depicts the positive tone resist pattern created on dry development of the etch-resistant latent image.

Figure 5:
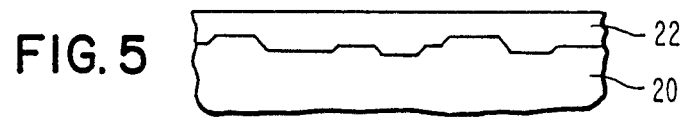
FIGS. 5–7 depict a method wherein a negative tone etch-resistant latent image is created by: applying a layer of polymeric resist material to a substrate; exposing the layer of polymeric resist material to radiation capable of increasing permeability within the polymeric resist in the irradiated area; and preferentially permeating an organometallic compound (which may be in gaseous or condensed form) into the permeable, irradiated areas of the resist to provide an etch-resistant negative tone latent image within the resist. The latent image within the resist is then dry developed to produce the patterned resist shown in FIG. 8. These figures represent three embodiments of the present invention: the embodiment wherein the organometallic material merely permeates and remains in place; the embodiment wherein there are reactive sites throughout the polymeric resist material capable of reacting with the organometallic material, and reaction occurs within the areas where the organometallic material is able to preferentially permeate; and the embodiment wherein there are not reactive sites throughout the organometallic material, however, the exposure to radiation which creates porosity simultaneously creates reactive sites in the more permeable areas, so that the organometallic material is able to preferentially permeate and react.
Figure 6:
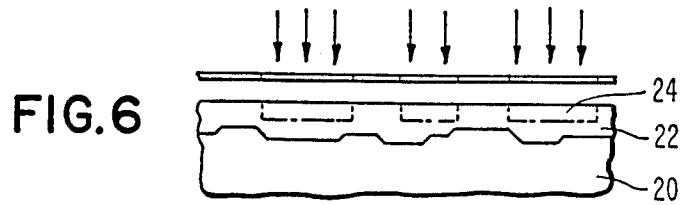
Figure 7:
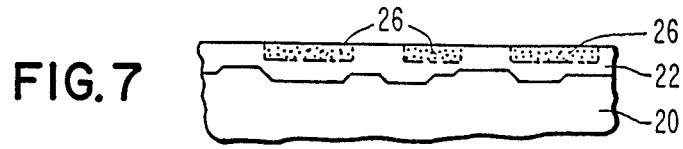
Figure 8:
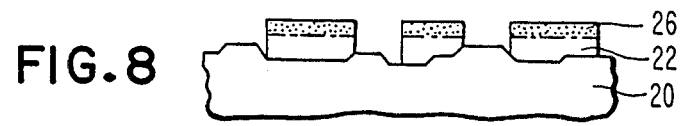

Referring now to FIGS. 5–8 which can be used to illustrate three embodiments of the method of the invention which creating a negative tone pattern in the resist: A layer of polymeric resist material 22 is applied to a substrate 20, as shown in FIG. 5. The surface of the polymeric resist material 22 is then exposed to patterned radiation in order to increase permeability in the exposed areas 24, as depicted in FIG. 6. Again, method of pattern creation and depth of penetration of the radiation can depend on the application. Next, an organometallic material is applied over the surface of the polymeric resist material 22,24 and allowed to preferentially permeate/diffuse into the areas of increased permeability 24 to produce etch-resistant areas 26 as shown in FIG. 7. The organometallic material may merely diffuse and remain in place in the more permeable areas; the organometallic material may react with functional groups at sites existing within the polymeric resist, wherein such sites exist throughout the entire polymeric resist material, but reaction occurs only within the permeable areas into which permeation/penetration can occur. The organometallic material may react at sites existing only within the irradiated areas of the polymeric resist, such reactive sites being created via irradiation (the same radiation as that used to create the permeability, or another kind of radiation applied in the same pattern as that used to increase the permeability). FIG. 8 depicts the negative tone resist pattern created on dry development of the etch-resistant latent image.

Figure 9:
FIGS. 9–12 depict a method wherein a positive tone etch-resistant latent image is created by: applying a layer of polymeric resist material to a substrate; exposing the layer of non-metal-containing polymeric resist to radiation capable of crosslinking the polymeric resist in the irradiated area; exposing the layer of polymeric resist material to radiation capable of creating reactive sites at least in the non-crosslinked area of the polymeric resist (FIG. 11 B) or throughout the polymeric resist material (FIG. 11 A); and preferentially permeating and reacting an organometallic material into the permeable, non-crosslinked area of the resist. The etch-resistant latent image created within the resist is dry developed to produce the patterned resist shown in FIG. 13.
Figure 10:
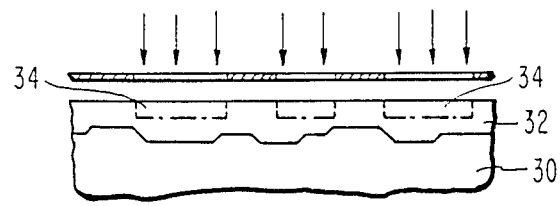
Figure 11A:
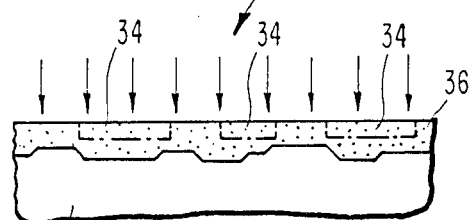
Figure 11B:
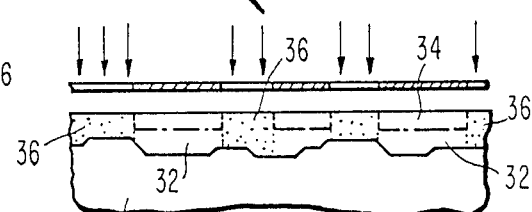
Figure 12A:
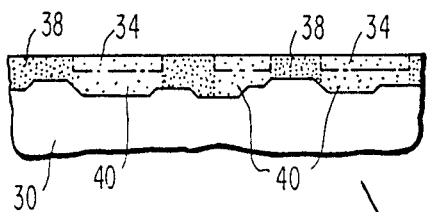
Figure 12B:
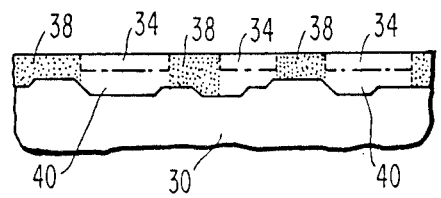
Figure 13:
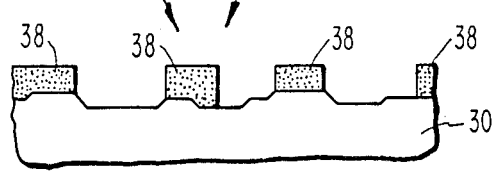

FIGS. 9–13 depict an additional preferred embodiment of the present invention in which a positive tone pattern is created within the resist. In this embodiment, the organometallic material is reacted with irradiation-created sites within the resist. A layer of polymeric resist material 32 applied over the surface of a substrate 30, as shown in FIG. 9. The surface of the polymeric resist material 32 is then exposed to patterned radiation in order to reduce permeability in the exposed areas 34, as shown in FIG. 10. The polymeric resist material contains no sites capable of the desired reaction with an organometallic material, so such sites are created using radiation. However, since a positive tone pattern is desired, the reactive sites must be created in areas which were not initially exposed to radiation (areas other than 34). The reactive-site-creating radiation can be applied over the entire surface of the polymeric resist material, as shown in FIG. 11A. This blanket application of radiation may result in creation of the reactive sites 36 throughout the entire polymeric resist material 32, depending on the effect of the initial radiation (applied as shown in FIG. 10) upon the absorption characteristics in the initially irradiated areas. Or, the reactive-site-creating radiation can be selectively applied, as shown in FIG. 11B, in a pattern which is the reverse of the pattern of the initial radiation (applied as shown in FIG. 10). This selective application of the reactive-site-creating radiation results in formation of reactive sites 36 only within the specifically irradiated areas of the polymeric resist material 32. The organometallic material is next applied to the surface of the polymeric resist material and allowed to preferentially permeate/diffuse into the permeable areas. Permeability-controlled reaction occurs within particular areas of the resist 38 as shown in FIG. 12A. Reactive sites exist throughout the polymeric resist material; however, the organometallic material is prevented from reaching reactive sites within the impermeable (or less permeable) areas 34 or areas 40 protected by the impermeable areas 34. Permeability-controlled permeation/penetration of the organometallic material can be even further controlled within particular areas of the resist 38 as shown in FIG. 12B. Selective application of the reactive-site-creating radiation has limited reactive sites to areas 38, and presence of the organometallic material in areas not containing reactive sites is prevented within the impermeable areas 34 and areas 40 protected by the impermeable areas 34. FIG. 13 depicts the positive tone pattern obtained on dry development of the etch-resistant latent image 38.

Figure 14A:
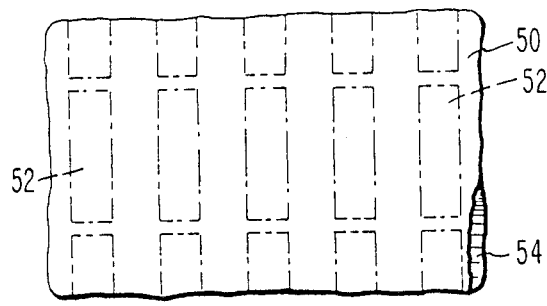
Figure 15:
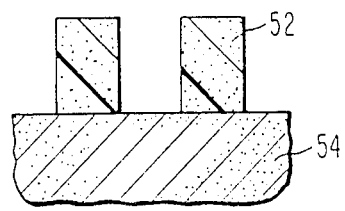
Figure 14B:
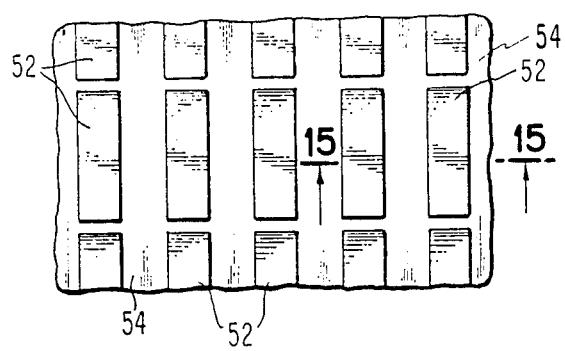
Figure 16A:
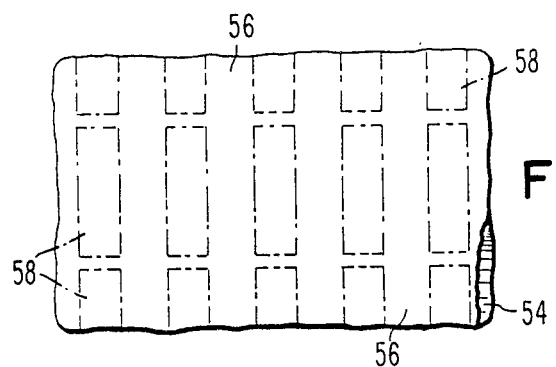
Figure 17:
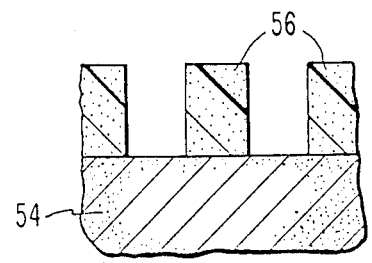
Figure 16B:
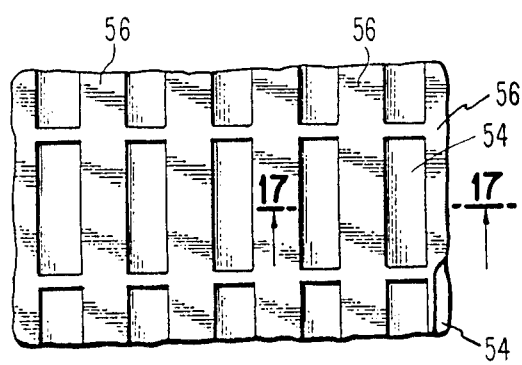
Figure 18:
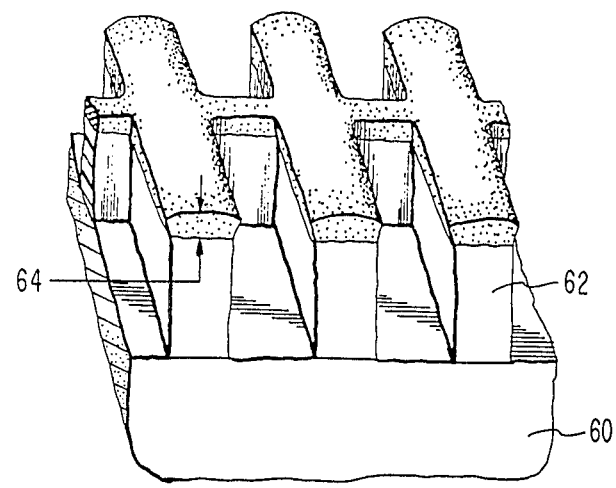
FIGS. 18 and 19 depict views of dry developed resist patterns and the type of resist profiles which can be obtained when the change in permeability of the resist material upon irradiation or the permitted permeation by the organometallic reagent is limited to the upper portion of the resist thickness. When this occurs, the etch-resistant portion of the polymeric resist is limited to the upper portion of the resist, and either a straight-walled resist structure profile or an undercut resist structure profile (of the kind shown in FIGS. 18 and 19) can be obtained, depending on the oxygen etching conditions used. Note that when permeability of the resist occurs through the entire resist thickness and permeation/diffusion through the entire thickness by the organometallic reagent is permitted, the entire thickness becomes etch-resistant. Then, the etched resist profile through the thickness of the resist will depend mostly on the spatial distribution of the radiation intensity through the thickness of the resist layer, and to some extent on the diffusion process.
Figure 19:
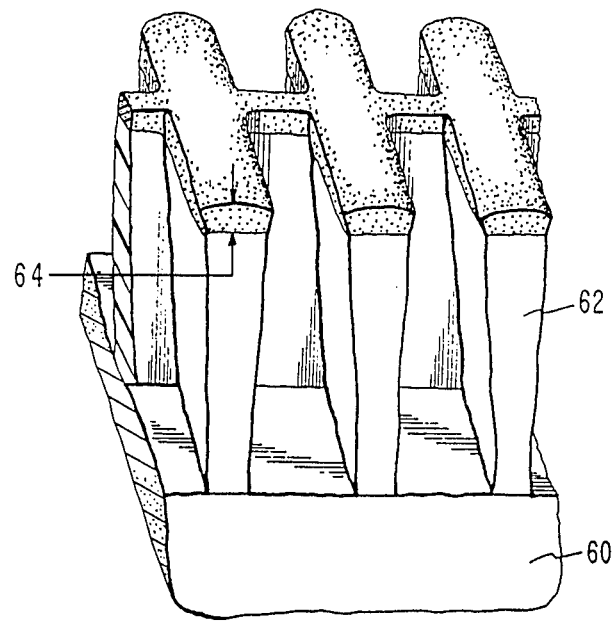

It has also been discovered that either a negative tone image or a positive tone image can be obtained using the method of the present invention, wherein the method steps are modified only by the addition of a crosslinking reagent to the polymeric resist material, a change in the type or intensity of the radiation applied, or a combination of both. This feature of the present invention is illustrated in FIGS. 14A–17. In FIG. 14A a layer of polymeric resist material 50 is applied to the surface of a substrate 54, using methods described previously. Patterned radiation is applied to create areas of increased permeability 52 within the polymeric resist material 50, as depicted in FIG. 14A. An organometallic reagent is then applied and preferential permeation occurs in the more permeable areas 52. The dry developed resist pattern is a negative tone pattern, as shown in FIGS. 14B and 15, wherein the etch-resistant areas 52 remain on the substrate 54. In order to obtain a positive tone pattern, a crosslinking reagent is added to the polymeric resist material, the type or intensity of radiation is changed, or a combination of both may be used. As shown in FIG. 16A, a polymeric resist material 56 is applied to a substrate 54, by methods previously described. Upon irradiation, the irradiated areas 58, decrease in permeability. An organometallic reagent is applied and preferential permeation/diffusion occurs in the more permeable areas 56. The dry developed resist pattern is a positive tone pattern, as shown in FIG. 16B and 17, wherein the etch-resistant areas 56 remain on the substrate 54. Again, the radiation used to alter the permeability of the resist may penetrate the entire resist thickness, or may only partially penetrate the resist thickness as previously described. The ability to alter the profile of the wall structure of the patterned resist depends on a variety of factors, including uniformity of radiation intensity through the resist thickness, the depth of penetration of the radiation into the resist thickness, the depth and degree of permeation by the organometallic material and dry development conditions, as previously described. FIGS. 15 and 17 show straight wall structures obtained when the organometallic material permeates the entire resist thickness. FIGS. 18 and 19 show the undercut wall structures which can be obtained when the organometallic material permeates to only a limited depth 64 within the polymeric resist material 62 upon substrate 60.

With the above disclosure of the method of the present invention in mind, the following descriptions of materials which can be used within the method of the invention are presented:

To obtain a negative tone image:

1. Polymeric resist materials are comprised of photodegradable polymers which undergo chain scission or fragmentation upon irradiation. Polymers of this type containing the functional groups capable of reacting with organometallic materials are preferred. Examples of photodegradable polymers include, but are not limited to copolymers of methyl methacrylate and methacrylic acid; terpolymers of methyl methacrylate, methacrylic acid and methacrylic anhydride; copolymers containing 2,4-dimethylglutarimide or maleimide; poly (2,4-dimethylglutarimide); copolymers or terpolymers containing methacrylic acid, esterified methacrylates, styrene or substituted styrenes, such as α methyl styrene. These polymers can be used as polymeric resist materials in themselves, or can be combined with photoactive compounds to enhance the change in permeability upon irradiation.

2. If the kind or intensity of radiation to be used does not cause photodegradation of the polymer either because the polymer does not absorb the radiation or because the polymer is not sensitive enough to the radiation, photoactive (photofragmentable) compounds can be added to the polymer to make up the polymeric resist. Upon irradiation, the fragmented products of the photoactive compound loosen the resin matrix to aid increase permeability in the irradiated area. In addition, the photoactive compound may change the polarity and hydrophilicity of the polymeric resist material upon irradiation and thus contribute to the change in permeability.

3. Polymers which would normally be viewed as polymers in which crosslinking would be the predominant reaction upon irradiation can also be used to produce negative tone images, when exposure to the particular source of radiation does not result in a significant amount of crosslinking. Polymers of this type include novolak resins, polyvinylphenols, polymers containing azido groups, and their derivatives. For example, novolak resins can be used in combination with a photoactive compound to produce a negative tone resist pattern when the souce of radiation is near UV (350–450 nm). Although the photoactive compound will photodegrade at this UV wavelength, the novolak resins do not absorb near UV photons. Thus, by selecting the proper source of radiation, the polymer to be used to produce a negative tone patterned resist can be chosen from a wide range of types of polymers. Examples of polymers which can be used in this manner include (but are not limited to) novolak resins, resoles, polyvinylphenol, polymers discussed under 1. above, polyimides including polyamic acid, polyisoimide, and polyvinylpyrrolidone.

The photoactive components can be part of the polymer used or can be separate molecules. Examples of photoactive compounds include (but are not limited to) compounds of the following general structures:

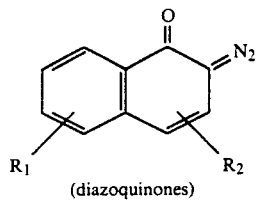

(diazoquinones)

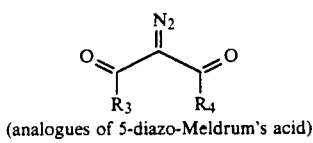

(analogues of 5-diazo-Meldrum's acid)

where $R_1$, $R_2$ can be H, alkyl, aryl, halogen, alkoxyl, or esterified sulfo groups; $R_3$, $R_4$ represent alkyl, aryl, part of cyclic or heterocyclic groups. Molecules containing two or three of the diazoquinone groups are also included. In addition, poly(alkene sulfone)s such as poly(butene-1-sulfone) which are used as photoactive compounds in electron-beam resists can act as photoactive compounds in combination with the above-mentioned polymers.

4. The radiation source to be used when the photodegradable polymers are used should be radiation sources which cause rapid chain-scission or fragmentation, so that minimal use of photoactive compounds in combination with such polymers is possible. However, in some cases it may be desirable to use a photoactive compound in combination with the polymer in order to tailor the absorption spectrum of the polymeric resist material to match the output of the available high-intensity exposure tool. When predominantly crosslinking polymers are used and scission is desired, the range of radiation used should exclude that which causes crosslinking of the polymer.

5. Special attention must be paid to the solvent characteristics of the organometallic material used to permeate the polymeric resist material, so that the organometallic material (particularly any solvent used as a carrier for an organometallic compound) does not attack or dissolve the polymeric resist film.

To obtain a positive tone image:

1. Photocrosslinkable polymers comprising functional groups such as hydroxy, carboxyl, phenol, amine, and imide NH are preferred. Examples of such polymers include (but are not limited to) novolak resins, resoles, epoxides, polymers containing azido groups and polyvinyl phenol. These polymers can be used alone or in combination with photoactive compounds to make up the polymeric resist material.

2. A combination of polymer and photoactive compound is useful when the radiation used does not crosslink the polymer molecules by themselves (because the polymer is not sensitive enough to the radiation or because the polymer does not absorb the radiation). Photoactive compounds are then used to induce the reactions necessary to alter the permeability in the exposed areas of the polymeric resist material. Upon irradiation, the photoactive compounds may cause the polymer to crosslink or may react with the polymer to crosslink polymer molecules. Additives such as polyfunctional monomers, prepolymers containing double bonds, and epoxy groups can be used together with the photoactive compounds in resist materials.

3. Predominantly scission/fragmentation polymers (such as copolymers containing methacrylic acid or esters) can be used so long as the radiation source used will not degrade the polymer to the extent that the crosslinking reactions initiated by the photoactive compound are not the dominant reactions.

4. Thus, with the proper source of radiation to preclude excessive photodegradation, the polymer can be chosen from a wide range of polymers.

5. The photoactive compounds can be part of the polymer itself or can be separate molecules. For example, photoactive compounds include, but are not limited to, azides of the general structure:

$RN_3$ where R may be alkyl, aryl, acyl, or sulfonyl; bisazides which have two azido groups on the same molecule; or azide group incorporated as a polymer side chain. Azides which have been used include di-(p-azidophenyl)sulfide, di-(m-azidophenyl)sulfone and 3,3'-diazidobenzophenone in novolak resins.

6. Polymeric resist materials containing polymeric resins and unsaturated monomers, branched monomers such as polyfunctional acrylates, or prepolymers can be used with sensitizers/photoinitiators to enhance their sensitivity towards crosslinking. Sensitizers/photo initiators used in this application include (but are not limited to) naphthothiazoline, nitrophenyl derivatives, azides, and quinones. When the sensitizer/photo-initiator (such as an onium salt) cationically initiates addition reactions, polyfunctional epoxy molecules can be used as additives in polymers or as part of the polymer. Polymerization or crosslinking in the irradiated areas acts to reduce the permeability of the polymeric resist material.

7. The radiation source used should be one which causes rapid crosslinking of the polymer in the irradiated areas. However, a photoactive compound can be used to tailor the polymeric resist material to the absorption spectrum of available high-intensity exposure tools. With the proper radiation source and a matched photoactive compound in the polymeric resist material, crosslinking can become the dominant reaction even when photodegradable polymers and polymers which in themselves have only a moderate propensity to crosslink are used.

EXAMPLES

EXAMPLE 1

A positive tone resist pattern was obtained in the following manner:

A polymeric resist material comprised of a mixture of a derivative of 2-diazonaphthoquinone-5-sulfonic acid (photoactive compound) in m-cresol formaldehyde novolak resin (polymeric material) was applied to a silicon wafer substrate using standard spin coating techniques. The concentration of photoactive compound was varied between about 17% to about 25% by weight of the resist material; an increased amount of photoactive compound increased the degree of permeability modification within the polymeric resist material. For purposes of this example, the 25% concentration of photoactive compound is preferred. The polymeric resist material was applied using 2-ethoxyethyl acetate:n-butyl acetate (about 90:10) solvent, to form a solution of the polymeric resist material for spin coating. The concentration of polymeric resist material was about 30% by weight of the solution. Application of the resist to the silicon wafer was followed by an oven bake at temperatures ranging between about 80° C. to about 105° C., for a period ranging from about 25 minutes to about 40 minutes to remove the solvent used during spin coating. Higher bake temperatures decreased the overall permeability of the polymeric resist material. For purposes of this example, a bake temperature ranging between about 80° C. and about 85° C. for a period of about 30 minutes is preferred. The thickness of the dry resist material layer was about 2 micrometers.

The polymeric resist material was exposed to patterned radiation using a commercially available reflective scan projection tool and "deep" UV exposure (220 to 280 nm). The dosage was varied from about 50 to about 300 mJ/cm$^2$. This "deep" UV radiation resulted in an overall crosslinking effect, wherein crosslinking played a more dominant role than the photofragmentation of the diazoquinones in the exposed areas. The effect of the crosslinking in the irradiated areas was to reduce the permeability of the irradiated areas to organometallic materials (including the organometallic compound itself and any solvent molecules used as a carrier for the organometallic compound).

Next, the irradiated resist was treated with an organometallic material comprised of about 5% hexamethylcyclotrisilazane (HMCTS) in o-xylene at about 65° C. for a time period which was varied from about 2 minutes to about 15 minutes. The preferred temperature and time period depends on the degree of permeation/penetration of the organometallic material desired, and for this polymeric resist material the time period used was about 10 to about 15 minutes. A detailed description of organometallic materials of this type which can be used to create etch-resistance in polymeric resists is described in U.S. patent application, Ser. No. 713,509 assigned to the assignee of the present invention, which is hereby incorporated by reference. The organometallic material preferentially permeated/diffused into the non-crosslinked, non-irradiated areas of the polymeric resist, and reacted to silylate the phenolic hydroxy groups of the novolak resin, creating a positive tone etch-resistant latent image within the upper portion of the polymeric resist material. After treatment of the irradiated polymeric material with the organometallic material, the wafer, including resist, was rinsed in pure o-xylene for about 10 seconds and then was blown dry using nitrogen.

The etch-resistant latent image was dry developed using an oxygen plasma in a Temescal parallel plate reactive ion etching tool. Conditions used during etching were about 100 sccm of O$_2$ at a pressure of about 50 millitorrs and a power input of about 500 Watts. The patterned resist created included line widths of about 1.25 micrometers at spacings of about 1.25 micrometers. The walls of the resist structure were straight and about 1.8 micrometers in height. FIGS. 1-4 illustrate this embodiment of the invention.

EXAMPLE 2

A negative tone resist pattern was created in the following manner:

The materials used and the method steps followed were essentially the same as described in EXAMPLE 1 with the following exceptions: The patterned radiation was "near" UV (350-450 nm) at a dosage ranging from about 150 to about 250 mJ/cm$^2$. Use of this type of radiation resulted in the dominant reaction being photofragmentation of the diazoquinone derivative photoactive compound. Thus, the permeability toward organometallic materials was increased in the upper portions of the irradiated areas of the resist material. Upon application of the organometallic material, the permeation was most rapid in the irradiated areas, so that an etch-resistant negative tone latent image was obtained upon silylation of the resist.

On dry development of the latent image, it was found that adding a small amount of CF$_4$ to the O$_2$ plasma sped up the etching of nonirradiated areas of polymeric resist material which contained minor amounts of the organometallic material. The dry-developed resist was a negative tone pattern which included line widths of 1.25 micrometers at line spacings of 1.25 micrometers, wherein the walls of the resist structure were straight and about 1.8 micrometers in height. FIGS. 5-8 illustrate this embodiment of the present invention (excluding any additional irradiation for purposes of reducing permeability in areas to prevent organometallic material permeation).

EXAMPLE 3

The embodiments of the present invention disclosed in EXAMPLES 1 and 2 utilized the polymeric resist material directly over a silicon wafer substrate. However, in order to provide a thick resist pattern with high aspect ratio (large height-to-line width ratio within the patterned resist), the method of the present invention can be utilized over a substrate of any second polymeric material which has been applied to the surface of the silicon wafer (or any electronic device substrate). Among potential second polymeric materials, those with high temperature (above 200° C.) stability are preferred. Examples include polyimides and hard-baked novolaks. In order to reduce the effort required in removing the resist structure after subsequent processing, a soluble polyimide was used in this example.

A negative tone resist pattern was obtained using the materials and method steps of EXAMPLE 2, with the following exceptions: A preimidized polyimide, a copolymer of 5(6)-amino-1-(4'-aminophenyl)-1,3,3-trimethylindane isomers with 3,3',3,4'-benzophenone tetracarboxylic dianhydride was used as the second polymeric substrate under the diazoquinone derivative/novolak polymeric resist material. The polyimide was applied to the surface of a silicon wafer from a gamma-butyrolactone solvent using standard spin coating techniques. The polyimide layer was dried using an oven bake at about 230° C. for a period of about 60 minutes in order to remove the solvent. The thickness of the dry polyimide layer was about 3 micrometers. The diazoquinone derivative/novolak resist material was applied over the surface of the dried layer of polyimide using techniques previously described. The thickness of the dry layer of resist material was about 2 micrometers.

Irradiation of the polymeric resist material was essentially the same as that described in EXAMPLE 2.

After dry development of the etch-resistant negative tone latent image, the developed pattern included line widths of 1.5 micrometers at line spacings of about 1.5 micrometers. The wall structures of the developed resist were slightly tapered as depth into the developed resist increased. After development, thickness of the patterned multilayer resist including polyimide underlaying was about 4.8 micrometers.

EXAMPLE 4

A positive tone resist pattern was created as follows: A polymeric resist material comprised of a bisazide photoactive compound, di(p-azidophenyl)sulfide, and a novolak resin synthesized from mixed isomers of cresol and formaldehyde was applied to the surface of a silicon wafer using standard spin coating techniques. The concentration of photoactive compound was varied between about 12 to about 18% by weight of the resist material. For purposes of this example, the 18% concentration of bisazide was preferred. The polymeric resist material was applied using diglyme as the casting solvent, wherein the polymeric resist material comprised about 30% by weight of the coating solution. Application of the polymeric resist material to the silicon wafer was followed by an oven bake at about 85° C. for a period of about 30 minutes, to remove the diglyme coating solvent. The thickness of the dried resist film was about 0.7 micrometers.

The polymeric resist film was exposed to patterned radiation using a commercially available reflective scan projection tool and deep UV exposure (220-290 nm). The dosage ranged from about 100 to about 200 mJ/cm$^2$. This deep UV radiation resulted in a dominant crosslinking reaction, wherein the nitrene generated from the photofragmentation of di(p-azidophenyl)sulfide induced the crosslinking reaction. Thus, the effect of the deep UV radiation was to reduce the permeability of the polymeric resist material in the irradiated areas to organometallic materials (organometallic compounds and solvent carrier molecules).

Upon application of the organometallic material in the manner described in EXAMPLE 1, but for a 2 minute time period, the diffusion was most rapid in the non-irradiated areas, so that an etch-resistant positive tone latent image was formed.

The irradiated and silylated resist was then etched in oxygen plasma using the same tool and conditions described in EXAMPLE 1. The dry-developed image produced a positive tone pattern with negligible resist film thinning. FIGS. 1-4 illustrate this embodiment of the invention.

EXAMPLE 5

A positive tone resist pattern was created in the same manner as EXAMPLE 4 using 3,3'-diazidobenzophenone as the photoactive compound in the m-cresol formaldehyde novolak resin. The concentration of photoactive compound was about 18% by weight of the resist material. Diglyme was used as the spin coating solvent and the resist material comprised about 30% by weight of the coating solvent.

The subsequent processing conditions through dry development were essentially the same as described in EXAMPLE 1, and the dry-developed pattern was as described in EXAMPLE 4.

EXAMPLE 6

A negative tone resist pattern was created as follows:
The polymeric resist material of EXAMPLE 1 (comprised of a diazoquinone derivative photoactive compound in novolak resin) was applied to a silicon wafer substrate using the spin coating techniques previously described.

The polymeric resist material was then exposed to radiation using a commercially available refractive step and repeat projection tool and a 405 nm lens. The dosage used was about 150 to about 250 mJ/cm$^2$.

Next, the irradiated resist was treated using 5% HMCTS in o-xylene at about 65° C. for a period of about 15 minutes, to allow diffusion and reaction of the organometallic material within the polymeric resist material. After treatment with the organometallic material, the wafer was rinsed in pure o-xylene for a period of about 10 seconds and then blown dry with nitrogen.

Dry development of the etch-resistant latent image was achieved using an oxygen plasma in a Temescal reactive ion etching tool. Operational conditions were 6 sccm oxygen flow rate and 5 mtorr pressure, at 500 Watts power. Note that low pressure conditions result in a developed resist pattern with a straight wall profile, whereas higher pressure conditions can be used to obtain an undercut wall profile.

The developed negative tone patterned resist was comprised of approximately 0.4 micrometer line widths at line spacings of about 0.5 micrometer. The wall profiles of the resist structure were somewhat tapered, as described in EXAMPLE 3, and the etch-resistant upper portion of the resist was intentionally undercut via a long 15 minute dry development period. The hight of the resist wall structure was nearly 2 micrometers, so that an aspect ratio of about 5 was achieved.

There are polymeric resist materials which can be utilized in the present invention which contain no functional groups (sites) capable of reacting with the organometallic material until after irradiation. Examples of such polymeric resist materials include the p-t-butoxycarbonyloxystyrene containing triphenylsulfonium hexafluoroarsenate which is described in U.S. patent application, Ser. No. 609,690, assigned to the assignee of the present invention, and previously incorporated by reference herein. Also included are the photo-fries rearrangement materials of the type described in U.S. patent application Ser. No. 679,527,, assigned to the assignee of the present invention, and previously incorporated by reference herein.

Only the preferred embodiments of the invention have been described above, and one skilled in the art will recognize that numerous substitutions, modifications and alterations are permissible without departing from the spirit and scope of the invention, as demonstrated in the following claims.

What is claimed is:

1. A method of creating etch-resistant polymeric films for use in the production of micron and submicron dimension patterns and fine lines, comprising:
    (a) applying a layer of polymeric resist material to a substrate;
    (b) exposing said layer of polymeric resist material to at least one kind of patterned radiation capable of altering the permeability of said polymeric resist material; and
    (c) preferentially permeating/diffusing an organometallic material into the surface of said polymeric resist material, to provide each resistance within the portion of said polymeric resist material within which significant permeation of said organometallic material occurs.

2. The method of claim 1 wherein exposure of said polymeric resist material to said patterned radiation decreases the premeability of said resist material within said irradiated areas.

3. The method of claim 1 wherein exposure of said polymeric resist material to said patterned radiation increases the permeability of said resist material within said irradiated areas.

4. The method of claim 1 wherein said organometallic material reacts with at least portions of said polymeric resist material.

5. The method of claim 1 wherein said organometallic material does not react with said polymeric resist material.

6. The method of claims 1, 2, or 3, wherein said etch-resistant portion, and any polymeric material protected by such etch-resistant portion, is dry developed using plasma or reactive ion etching, wherein the active plasma/etchant is oxygen or a combination of oxygen with a halogen-containing compound.

7. The method of claims 1, 2, or 3, wherein said polymeric resist material comprises a material selected from the group consisting of photodegradable polymers which undergo chain scission or fragmentation upon irradiation, mixtures of photoactive compound and polymeric material, and combinations thereof, wherein said polymeric resist material may or may not comprise functional groups capable of reacting with an organometallic material.

8. The method of claims 1, 2, or 3 wherein said polymeric resist material comprises a material selected from the group consisting of photocross linkable polymers, mixtures of polymeric resins with crosslinkable polyfunctional reagents, mixtures of polymeric resins with sensitizers/photoinitiators, and combinations thereof, wherein said polymeric resist material may or may not comprise functional groups capable of reacting with an organometallic material.

9. A method of creating positive tone etch-resistant polymeric films for use in the production of micron and submicron dimension patterns and fine lines, comprising:
(a) applying a layer of polymeric resist material to a substrate, wherein said polymeric resist material comprises a photocrosslinkable polymer;
(b) exposing said layer of polymeric resist material to patterned radiation, wherein said radiation induces crosslinking of said polymeric material as the dominant reaction; and
(c) preferentially permeating/diffusing an organometallic material into the surface of said polymeric resist material, to provide an etch-resistant latent image within said polymeric resist material, wherein said etch-resistance occurs within the portion of said polymeric resist material which has not been irradiated.

10. The method of claim 9, wherein said photocrosslinkable polymer contains functional groups capable of reacting with an organometallic material.

11. The method of claim 10, wherein said functional groups are selected from the group consisting of hydroxy, carboxyl, phenol, amine and imide NH.

12. The method of claim 9, wherein said photocrosslinkable polymer is selected from the group consisting of novolak resins, resoles, polyvinyl phenol, and polymers comprizing azido groups.

13. A method of creating positive tone etch-resistant polymeric films for use in the production of micron and submicron dimension patterns and fine lines, comprising:
(a) applying a layer of polymeric resist material to a substrate, wherein said polymeric resist material is a combination of a photoactive compound and at least one polymer;
(b) exposing said layer of polymeric resist material to patterned radiation, wherein said radiation induces crosslinking of said polymeric resist material as the dominant reaction; and
(c) preferentially permeating an organometallic material into the surface of said polymeric resist material, to provide an etch-resistant latent image within said polymeric resist material, wherein said etch-resistance occurs within the portion of said polymeric resist material which has not been irradiated.

14. The method of claim 13, wherein said photoactive compound comprises at least one azide of the general structure:

$$RN_3$$

where R may be alkyl, aryl, acyl, or sulfonyl, or an azide group incorporated as a polymer side chain.

15. The method of claim 14, wherein said at least one azide is selected from the group consisting of di-(p-azidophenyl)sulfide, di-(m-azidophenyl)sulfone and 3,3'-diazidobenzophenone.

16. The method of claim 13, wherein said photoactive compound is a sensitizer/photoinitiator selected from the group consisting of naphthothiazoline, nitrophenyl derivatives, azides, quinones, and onium salts.

17. The method of claim 13, wherein at least one of said at least one polymers contains functional groups capable of reacting with an organometallic material.

18. The method of claim 13, wherein said polymer is selected from the group consisting of unsaturated polymeric resins, polymeric resins combined with unsaturated monomers, branched monomers such as polyfunctional acrylates, epoxides, novolak resins, resoles, polyvinyl phenol, and polymers comprising azido groups.

19. The method of claim 13, wherein said at least one polymer is selected from predominantly scission/fragmentation polymers such as copolymers containing methacrylic acid or methacrylic esters, and wherein the radiation source used will not degrade the polymer to the extent that the crosslinking reactions initiated by said photoactive compound are not the dominant reactions.

20. The method of claims 9 or 13 including an additional step wherein said etch-resistant latent image is developed into a patterned resist using dry etching techniques such as plasma or reactive ion etching, wherein the active plasma/etchant is oxygen or a combination of oxygen with a halogen-containing compound.

21. A method of creating negative tone etch-resistant polymeric films for use in the production of micron and submicron dimension patterns and fine lines, comprising:
(a) applying a layer of polymeric resist material to a substrate, wherein said polymeric resist material is comprised of at least one photodegradable polymer which undergoes chain scission or fragmentation upon irradiation;
(b) exposing said layer of polymeric resist material to patterned radiation, wherein said radiation induces chain scission or fragmentation of said at least one photodegradable polymer as the dominant reaction; and
(c) preferentially permeating an organometallic material into the surface of said polymeric resist material, to provide an etch-resistant latent image within said polymeric resist material, wherein said etch-resistance occurs in the irradiated areas of said polymeric resist.

22. The method of claim 21 wherein said at least one photodegradable polymer contains functional groups capable of reacting with an organometallic material.

23. The method of claim 22 wherein said functional groups are selected from the group consisting of hydroxy, carboxyl, phenol, amine and imide NH.

24. The method of claim 21 wherein said at least one photodegradable polymer is selected from the group consisting of copolymers of methyl methacrylate and methacrylic acid, terpolymers of methyl methacrylate, methacrylic acid, and methacrylic anhydride, copolymers containing 2,4-dimethylglutarimide, copolymers containing maleimide, poly(2,4-dimethylglutarimide), copolymers containing methacrylic acid, terpolymers containing methacrylic acid, copolymers containing esterified methacrylates, terpolymers containing esterified methacrylates, copolymers containing α methyl styrene, and terpolymers containing α methyl styrene.

25. A method of creating negative tone etch-resistant polymeric films for use in the production of micron and submicron dimension patterns and fine lines, comprising:
(a) applying a layer of polymeric resist material to a substrate, wherein said polymeric resist material is a combination of a photoactive compound and at least one polymer, and wherein said at least one polymer may or may not be photodegradable.
(b) exposing said layer of polymeric resist material to patterned radiation, wherein said radiation induces chain scission or fragmentation of said photoactive compound, and chain scission or fragmentation of any photodegradable polymer present; and
(c) preferentially permeating an organometallic material into the surface of said polymeric resist material, to provide an etch resistant latent image within said polymeric resist material, wherein said etch-resistance occurs within the portion of said polymeric resist material irradiated.

26. The method of claim 25 wherein said at least one polymer contains functional groups capable of reacting with an organometallic material.

27. The method of claim 25 wherein said at least one polymer is selected from the group consisting of copolymers of methyl methacrylate and methacrylic acid, terpolymers of methyl methacrylate, methacrylic acid and methacrylic anhydride, copolymers containing 2,4-dimethylglutarimide, copolymers containing maleimide, poly(2,4-dimethylglutarimide), copolymers containing methacrylic acid, terpolymers containing methacrylic acid, copolymers of esterified methacrylates, terpolymers containing esterified methacrylates, copolymers of styrene, terpolymers of styrene, copolymers of substituted styrenes, terpolymers of substituted styrenes, novolak resins, resoles, polyvinylphenols, polyimides including polyamic acid, polyisoimide, and polyvinylpyrrolidone.

28. The method of claim 25 wherein said photoactive compound is selected from the group consisting of compounds comprising at least one of the following general structures:

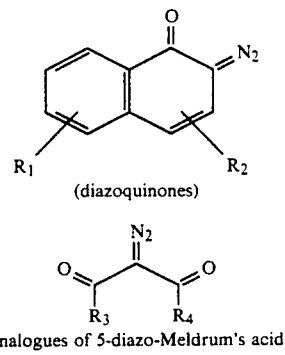

(diazoquinones)

(analogues of 5-diazo-Meldrum's acid)

where $R_1, R_2$ can be H, alkyl, aryl, halogen, alkoxyl, or esterified sulfo groups; $R_3$, $R_4$ represent alkyl, aryl, part of cyclic or heterocyclic groups.

29. The method of claim 25 wherein said photoactive compound is poly(alkenesulfone).

30. The method of claim 21 or 25 including an additional step wherein said etch-resistant latent image is developed into a patterned resist using dry etching techniques such as oxygen reactive ion etching, and plasma and ion etching wherein the active etchant is a combination of oxygen with a halogen-containing compound.

* * * * *

UNITED STATES PATENT AND TRADEMARK OFFICE
CERTIFICATE OF CORRECTION

PATENT NO. : 4,613,398

DATED : Sept. 23, 1986

INVENTOR(S) : Kaolin N. Chiong, Bea-Jane L. Yang, Jer-Ming Yang

It is certified that error appears in the above-identified patent and that said Letters Patent is hereby corrected as shown below:

| | |
|---|---|
| Col. 1, line 56 | prior to "oxime", delete "siliconcontaining" and insert --silicon-containing-- |
| Col. 2, line 54 | delete line 54 and insert in its place --Pat. No. 4,552,833 to Ito et al. and U.S. patent applications Ser. Nos.-- |
| Col. 2, line 55 | prior to "679,527", delete "1984, U.S. Pat. No. 4,552,833" |
| Col. 3, line 11 | after "in", delete "appli-" and insert --U.S. Pat. No. 4,552,833 to Ito et al. and U.S. patent application Ser. No.--. |
| Col. 3, line 12 | prior to "679,527" delete "cations Ser. Nos. 609,690 and" |
| Col. 18, line 35 | after "U.S.", delete "patent" and insert --Pat. No. 4,552,833 to Ito et al.-- |
| Col. 18, line 36 | prior to ", assigned", delete "application, Ser. No. 609,690" |

UNITED STATES PATENT AND TRADEMARK OFFICE
CERTIFICATE OF CORRECTION

PATENT NO. : 4,613,398

DATED : Sept. 23, 1986

INVENTOR(S) : Kaolin N. Chiong, Bea-Jane L. Yang, Jer-Ming Yang

It is certified that error appears in the above-identified patent and that said Letters Patent is hereby corrected as shown below:

IN THE CLAIMS:

The following claims were omitted from the original printing:

31. The method of Claim 1, wherein said alteration of said permeability to provide either a positive tone pattern or a negative tone pattern is controlled by the intensity or type of radiation used to alter said permeability of said polymeric resist material.

32. The method of Claim 31, wherein said alteration of said permeability to provide either said positive tone pattern or said negative tone pattern is controlled by the wavelength of said radiation.

33. The method of Claim 31, wherein a crosslinking reagent is added to said polymeric resist material so that the combination of said type or intensity of radiation with the presence of said crosslinking reagent enables control of said pattern tone.

UNITED STATES PATENT AND TRADEMARK OFFICE
CERTIFICATE OF CORRECTION

PATENT NO. : 4,613,398

DATED : Sept. 23, 1986

INVENTOR(S) : Kaolin N. Chiong, Bea-Jane L. Yang, Jer-Ming Yang

It is certified that error appears in the above-identified patent and that said Letters Patent is hereby corrected as shown below:

34. The method of Claim 1, wherein a crosslinking reagent is added to said polymeric resist material to enable the altering of said permeability so that pattern tone is reversed from what it would have been absent said crosslinking reagent.

On the title page " 30 Claims" should read --34 Claims--.

Signed and Sealed this

Sixteenth Day of December, 1986

*Attest:*

DONALD J. QUIGG

*Attesting Officer*     *Commissioner of Patents and Trademarks*

UNITED STATES PATENT AND TRADEMARK OFFICE
CERTIFICATE OF CORRECTION

PATENT NO. : 4,613,398
DATED : September 23, 1986
INVENTOR(S) : Kaolin N. Chiong, Bea-Jane L. Yang & Jer-Ming Yang It is certified that error appears in the above-identified patent and that said Letters Patent is hereby corrected as shown below:

Column 18, line 61, "each" should be --etch--.

Signed and Sealed this

Twenty-second Day of March, 1988

Attest:

DONALD J. QUIGG

*Attesting Officer*       *Commissioner of Patents and Trademarks*